(12) United States Patent
Nemani et al.

(10) Patent No.: US 10,879,094 B2
(45) Date of Patent: Dec. 29, 2020

(54) ELECTROSTATIC CHUCKING FORCE MEASUREMENT TOOL FOR PROCESS CHAMBER CARRIERS

(71) Applicant: APPLIED MATERIALS, INC., Santa Clara, CA (US)

(72) Inventors: Srinivas D. Nemani, Sunnyvale, CA (US); Gautam Pisharody, Newark, CA (US); Seshadri Ramaswami, Saratoga, CA (US); Shambhu N. Roy, Fremont, CA (US); Niranjan Kumar, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 238 days.

(21) Appl. No.: 15/360,412

(22) Filed: Nov. 23, 2016

(65) Prior Publication Data

US 2018/0144959 A1 May 24, 2018

(51) Int. Cl.
*H01L 21/67* (2006.01)
*H01L 21/683* (2006.01)
*G01R 29/12* (2006.01)

(52) U.S. Cl.
CPC ........ *H01L 21/67288* (2013.01); *G01R 29/12* (2013.01); *H01L 21/67253* (2013.01); *H01L 21/6831* (2013.01); *H01L 21/6833* (2013.01); *H01L 21/6838* (2013.01)

(58) Field of Classification Search
CPC ........... H01L 21/67288; H01L 21/6831; H01L 21/67253; H01L 21/6833; H01L 21/6838; G01R 29/12

USPC .......................................................... 438/17
See application file for complete search history.

(56) References Cited

U.S. PATENT DOCUMENTS

| | | | |
|---|---|---|---|
| 4,856,456 A | * | 8/1989 | Hillman ................... B05C 11/08 118/500 |
| 5,917,327 A | | 6/1999 | Haley et al. |
| 9,138,978 B2 | | 9/2015 | Wimplinger et al. |
| 2002/0067585 A1 | * | 6/2002 | Fujiwara ................ H02N 13/00 361/234 |

(Continued)

FOREIGN PATENT DOCUMENTS

| | | |
|---|---|---|
| JP | H02-249935 | 10/1990 |
| JP | 2648766 | 9/1997 |

(Continued)

OTHER PUBLICATIONS

International Search Report and Written Opinion from PCT/US2017/060245 dated Feb. 19, 2018, 15 pgs.

(Continued)

*Primary Examiner* — Farhana A Hoque
(74) *Attorney, Agent, or Firm* — Schwabe, Williamson & Wyatt, P.C.

(57) ABSTRACT

An electrostatic chucking force tool is described that may be used on workpiece carriers for micromechanical and semiconductor processing. One example includes a workpiece fitting to hold a workpiece when gripped by an electrostatic chucking force by an electrostatic chuck, an arm coupled to the workpiece fitting to pull the workpiece through the workpiece fitting laterally across the chuck, and a force gauge coupled to the arm to measure an amount of force with which the workpiece fitting is pulled by the arm in order to move the workpiece.

19 Claims, 6 Drawing Sheets

(56) References Cited

U.S. PATENT DOCUMENTS

2008/0108154 A1* 5/2008 Son .................. H01L 21/67253
438/17
2010/0013169 A1* 1/2010 Monteen ............ H01L 21/6838
279/3

FOREIGN PATENT DOCUMENTS

| JP | 2009-004631 | 1/2009 |
| JP | 2014-131050 | 7/2014 |
| KR | 10-1413206 | 6/2014 |
| WO | 0129568 A1 | 4/2001 |

OTHER PUBLICATIONS

International Preliminary Report on Patentability from PCT/US2017/060245 dated Jun. 6, 2019, 13 pgs.
Notice of Preliminary Rejection from Korean Patent Application No. 10-2019-7017628 dated Aug. 28, 2020, 8 pgs.
Notice of Reasons for Rejection from Japanese Patent Application No. 2019-527438 dated Sep. 28, 2020, 9 pgs.

* cited by examiner

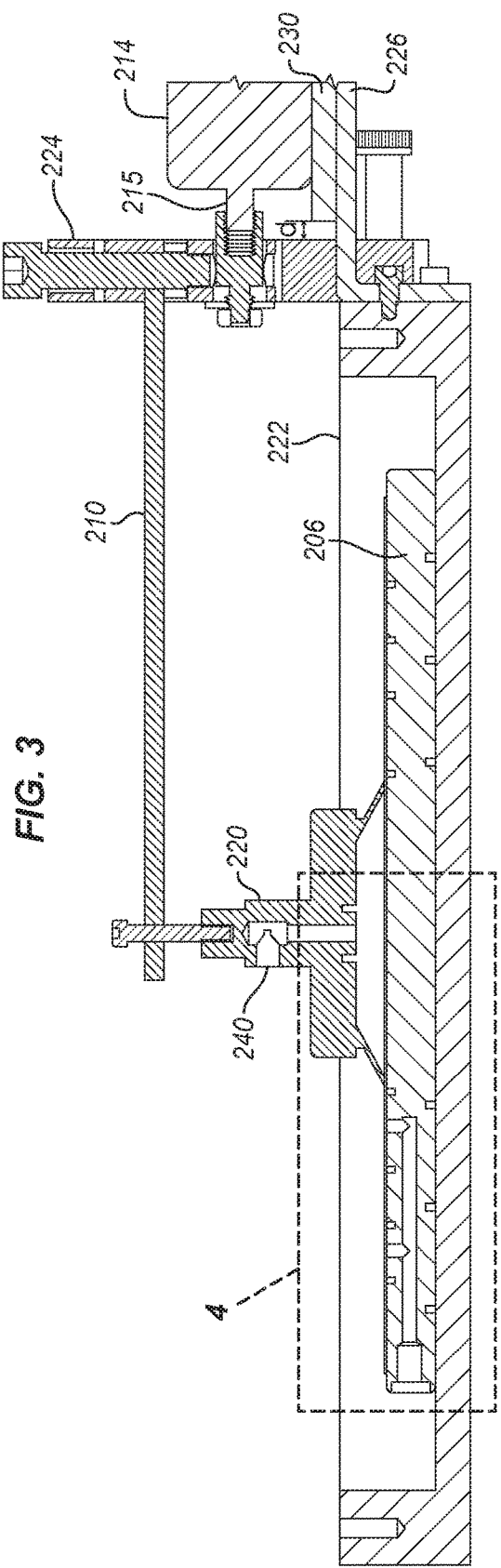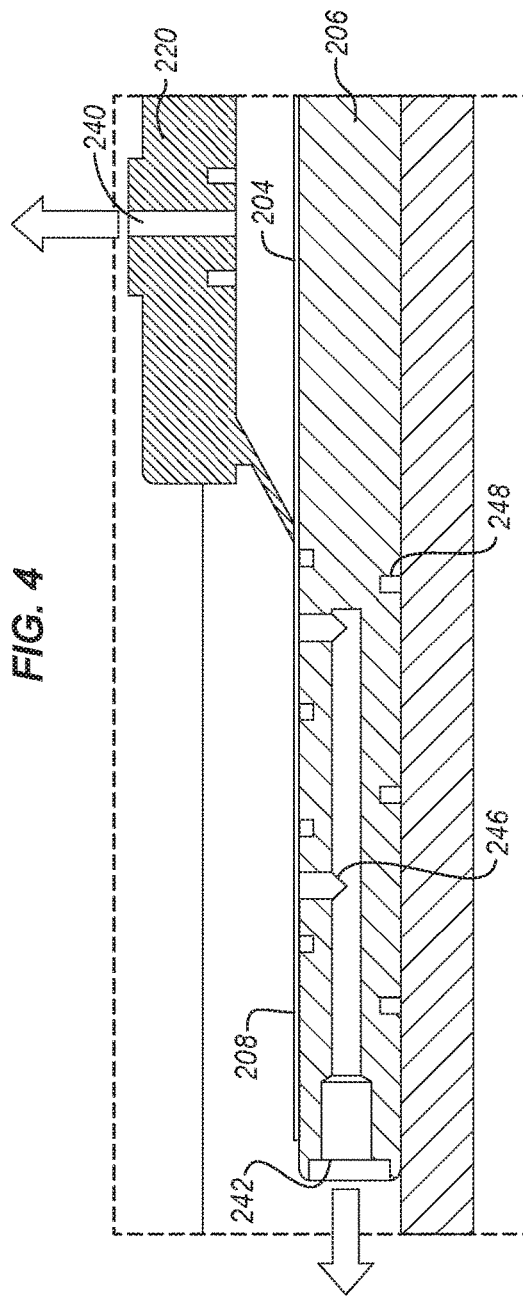

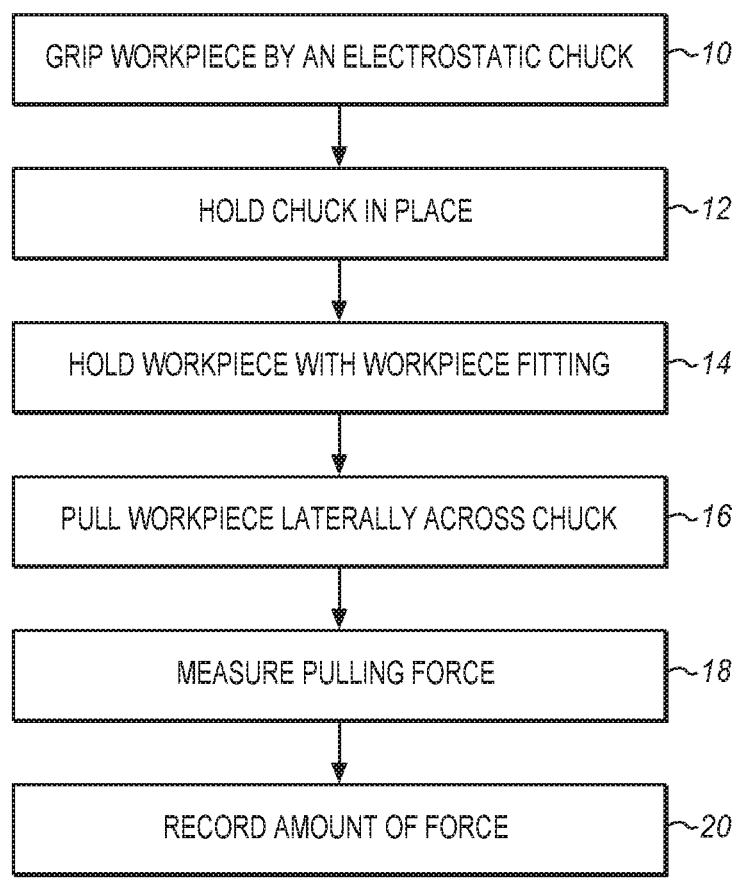

ELECTROSTATIC CHUCKING FORCE MEASUREMENT TOOL FOR PROCESS CHAMBER CARRIERS

FIELD

A tool is described for use with workpiece carrier in micromechanical and semiconductor processing and in particular a tool to measure an electrostatic chucking force applied to a workpiece by a workpiece carrier.

BACKGROUND

In the manufacture of semiconductor chips, a workpiece, such as a silicon wafer or other substrate is exposed to a variety of different processes in different processing chambers. The chambers may expose the wafer to a number of different chemical and physical processes whereby minute integrated circuits and micromechanical structures are created on the substrate. Layers of materials which make up the integrated circuit are created by processes including chemical vapor deposition, physical vapor deposition, epitaxial growth, and the like. Some of the layers of material are patterned using photoresist masks and wet or dry etching techniques. The physical processes may include drilling, planing, polishing, and other operations. The substrates may be silicon, gallium arsenide, indium phosphide, glass, or other appropriate materials.

The processing chambers used in these processes typically include a substrate support, pedestal, or chuck to support the substrate during processing. In some processes, the pedestal may include an embedded heater to control the temperature of the substrate and, in some cases, to provide elevated temperatures that may be used in the process.

An electrostatic chuck (ESC) has one or more conductive electrodes embedded within a dielectric material to generate an electric field that holds the wafer on the chuck using a Coulombic force or static electricity. The strength of the electric field and the pattern of the electrodes determine the grip strength of the ESC. The grip may have different amounts of force in different directions depending on the electrode pattern.

An ESC will have a top plate, a bottom plate, an electrode in between the top plate and the bottom plate and an interface or bonding method to hold the two plates together. The top surface of the puck has a contact surface that holds the workpiece which can be made of various materials, e.g. polymers, ceramic, or a combination, and may have coatings all over or over selective locations, etc. A variety of components are embedded into the puck including electrical components for holding or chucking the wafer, and thermal components for heating the wafer.

When a wafer is thinned, its structural rigidity is reduced. This makes it difficult to safely handle especially for operations like grinding, polishing, CVD (Chemical Vapor Deposition), PVD (Plasma Vapor Deposition), etc. In some cases, the wafer is attached to a carrier made of metal, ceramic or some structurally rigid material that compensates for the thinness of the wafer before the wafer is thinned. The carrier is attached to the wafer as a structural backing during thinning and other processes that may stress the wafer. Many of these carriers also use electrostatics to grip the wafer. The electrostatic carrier may be held in an ESC, a vacuum chuck, a pedestal, a tray, or any other holder depending on the process. This type of carrier is sometimes also referred to as an ESC, an ESC carrier, or a substrate.

SUMMARY

An electrostatic chucking force tool is described that may be used on workpiece carriers for micromechanical and semiconductor processing. One example includes a workpiece fitting to hold a workpiece when gripped by an electrostatic chucking force by an electrostatic chuck, an arm coupled to the workpiece fitting to pull the workpiece through the workpiece fitting laterally across the chuck, and a force gauge coupled to the arm to measure an amount of force with which the workpiece fitting is pulled by the arm in order to move the workpiece.

BRIEF DESCRIPTION OF THE DRAWINGS

Embodiments of the present invention are illustrated by way of example, and not limitation, in the figures of the accompanying drawings in which:

FIG. 3 is an enlarged cross-sectional side view diagram of a portion of the test tool of FIG. 2 in accordance with an embodiment of the invention;

FIG. 4 is an enlarged cross-sectional side view diagram of the lower vacuum chuck and the workpiece holder of FIG. 2 in accordance with an embodiment of the invention;

FIG. 9 is a process flow diagram for measuring an electrostatic chucking force in accordance with an embodiment.

DETAILED DESCRIPTION

A test tool is described for forces between the top surface of an ESC and a wafer placed and attached to it. With the described test tool, a wafer or other workpiece is chucked to an ESC with a known charge on the ESC electrode. The electrostatic chucking force applied by the ESC may then be measured by a force gauge while sliding the chucked wafer off of the ESC. To induce relative motion between the chuck and the wafer, the chuck is held stationary while the tool applies a lateral force to slide the wafer off the surface of the chuck. The force gauge measures the force needed to slide the wafer off the chuck. This force is proportional to the electrostatic force between the wafer and the chuck.

The measured electrostatic force and corresponding electrode design can be charted. This allows different electrode designs to be compared to determine an appropriate electrode design and amount of electric charge for a required amount of grip. The chucking force may vary based on design parameters such as electrode shape, dielectric thickness, substrate material, and the material properties of the wafer that the chuck is holding. The tool may also be used to determine how long a chuck retains a charge after the charge has been applied and to test chucks for manufacturing defects and damage or wear.

In one example, an ESC has an aluminum nitride (AlN) and glass construction. AlN is deposited to form an electrode that generates a Coulombic force to chuck or grip a wafer. Once the wafer is electrostatically chucked to the ESC, then the chuck and wafer assembly is carried over to a grinding station. For the wafer to be retained intact during these processes, the ESC must be able to hold a charge sufficient to sustain the shear forces of grinding and polishing or planarizing. The described tool is able to check the shear force that a particular chuck design can sustain. A thin wafer can also deform very easily due to variations in the chucking force compared to a full thickness wafer.

The described test tool may be used to qualify an ESC or other type of carrier to make sure it meets the chucking requirements that have been specified for it. It is easy to use and the setup is maintenance free as it has less moving components and the materials are chemical resistant. As described below, a vacuum chuck ensures that there is no mechanical contact of the chuck to the edges of an aluminum bath.

Figure 1:
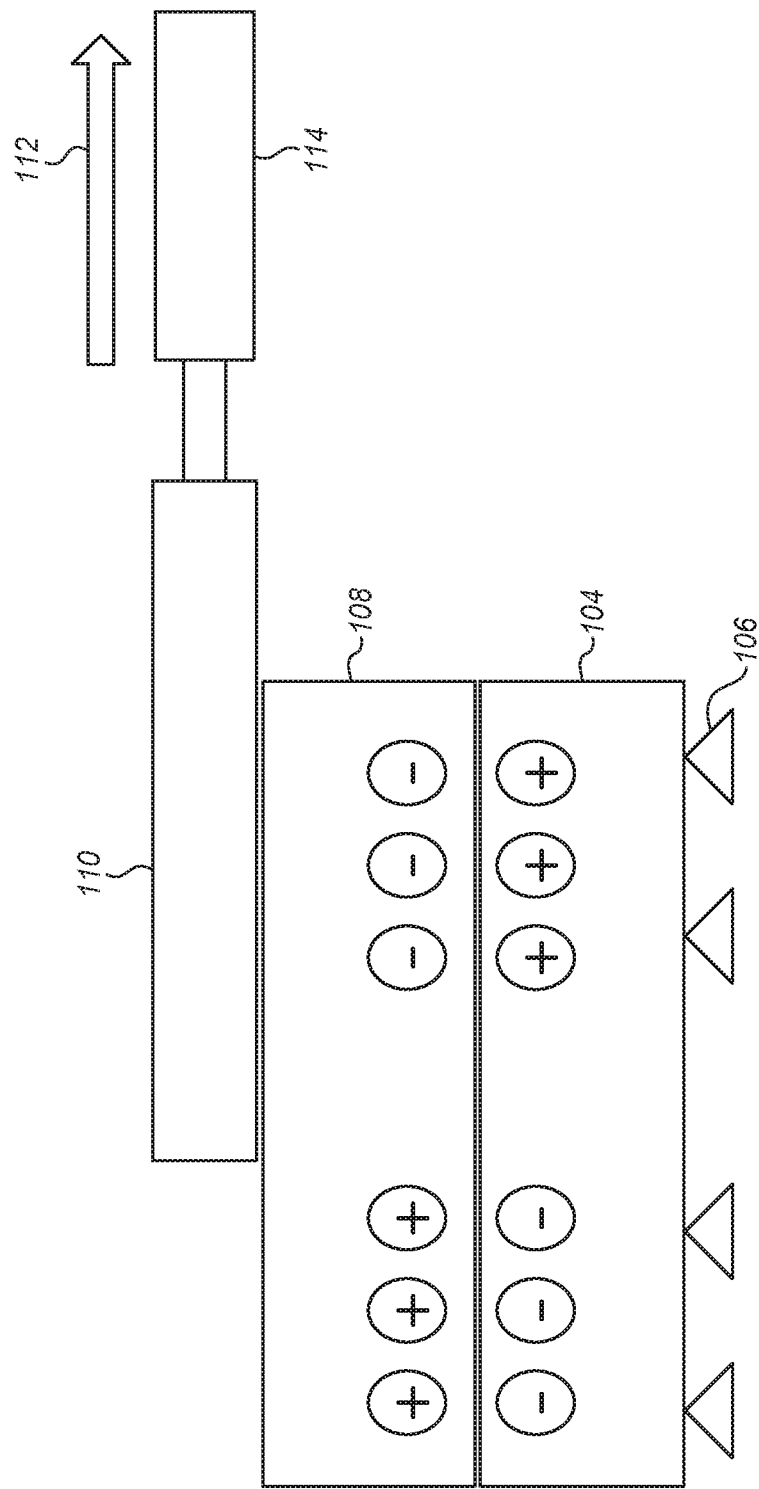
FIG. 1 is a generalized diagram of an electrostatic chucking force measurement tool in accordance with an embodiment of the invention.

FIG. 1 is a generalized diagram an electrostatic chucking force measurement tool. This tool holds an electrostatic chuck in place and then measures the electrostatic chucking force against lateral forces. An electrostatic chuck 104 is held in place with a holder 106. The holder prevents lateral movement of the chuck in at least one direction, the direction of the pull 112. The chuck has been charged and a wafer or other workpiece 108 has been electrostatically attached to the chuck.

The side view diagram suggests a bipolar electrode with a negative left hand side charge on the chuck and a positive right hand side charge. Any electrode configuration may be used and the present tool allows different electrode configurations to be tested so that electrode configurations may be better refined and adjusted than may be possible with no suitable test. The electrostatic force of the chuck creates an opposing charge in the wafer as shown so that the negative charge attracts the wafer by inducing a positive charge on the wafer and vice versa.

A handle 110 is attached to the top of the chucked wafer and this allows a pull to be applied to the wafer. The pull is in a direction 112 shown as toward the right in the drawing figure. The amount of pull is measured by a force gauge 114. When the pull force exceeds the electrostatic force of the chuck, then the wafer will move in the direction of the pull with respect to the chuck. This movement can be detected and the corresponding pulling force as measured by the force gauge 114 can be recorded. In this way, the ability of the chuck to hold the wafer can be measured.

Figure 2:
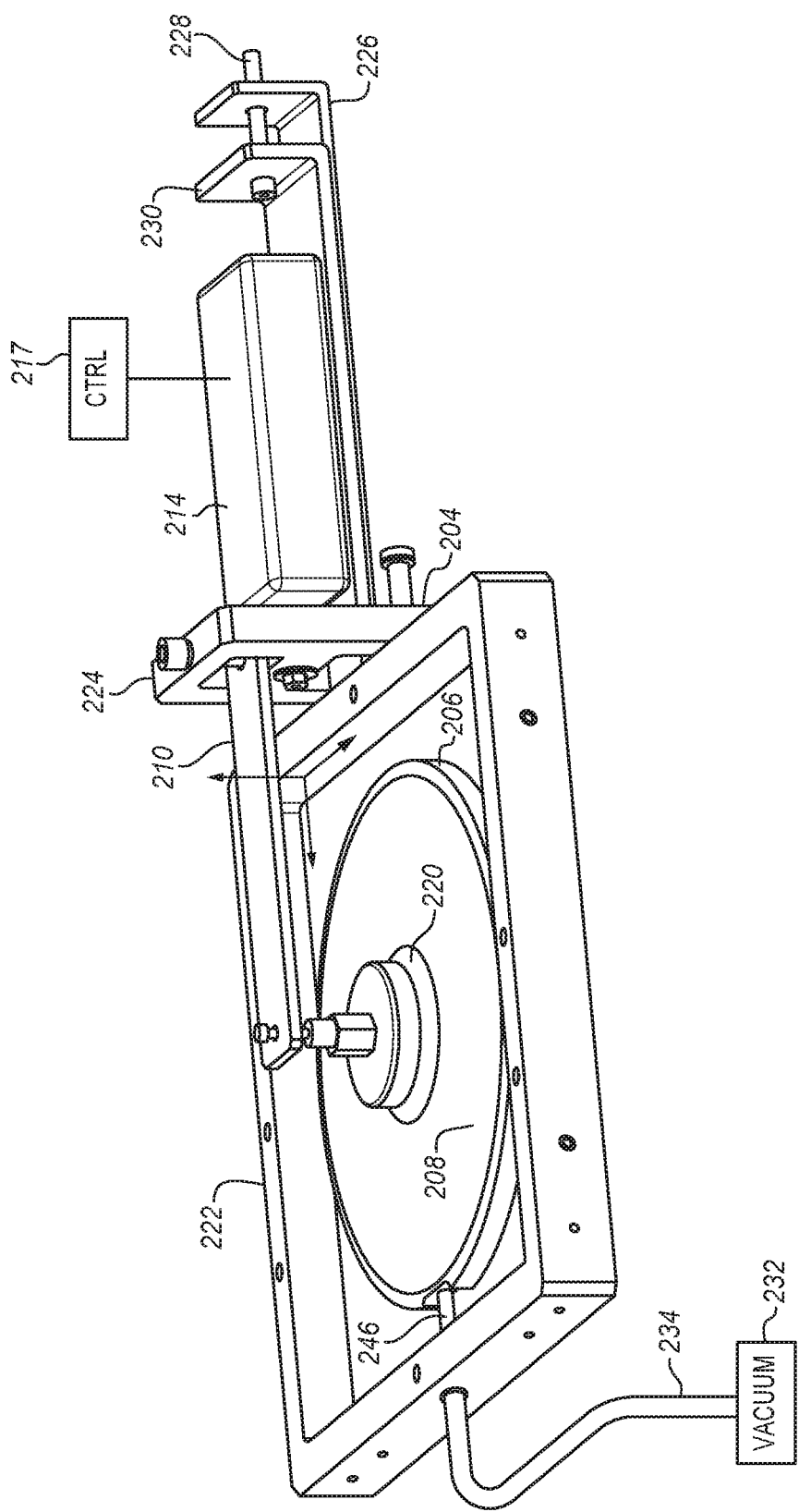
FIG. 2 is an isometric diagram of an electrostatic chucking force measurement tool in accordance with an embodiment of the invention.

FIG. 2 is an isometric diagram of another example of an electrostatic chucking force measurement tool in more detail. In this example, an electrostatic chuck (ESC) 204 is held in place by a separate chuck holder 206. In this case a vacuum chuck is used, however, any other type of attachment may be used that is more secure than the pulling force that is applied to try to remove the wafer. The vacuum chuck is optionally mounted to a tray 222. In this example, the tray is empty and provides structural support for all of the other test equipment. The tray may also be used as a bath to test the chuck when submerged under different chemicals. A tray may be made of aluminum or another suitable material. The wafer and ESC may be submerged or dipped in a chemical bath and the same shear test may be performed in different wet conditions.

As an alternative to the vacuum chuck, the ESC may be bolted or screwed to the tray. The bottom vacuum chuck 206 holds the ESC carrier 204 in place, without letting the carrier bump on the edges of the bath 222. Vacuum may be generated by connecting a CDA (Compressed Dry Air) line 234 from the vacuum chuck to a vacuum pump 232.

A wafer 208 is electrostatically attached to the chuck 204 that is being tested. A handle 210 is attached to the wafer by a workpiece fitting 220, in this case a suction cup. The suction cup may be connected to the same or to another vacuum pump. Any other type of attachment fitting other than a suction cup may be used, provided that the suction cup is attached more securely than the pulling force that is to be measured.

The wafer 208 is pulled horizontally (shear force) using the pneumatic suction cup 220 for which, again, a vacuum pump is used. The suction cup is attached to a handle 210 which is in turn connected to a sliding bracket 224 and then to a force gauge 214, which measures the force needed to slide the wafer off the ESC carrier. This force is proportional to the electrostatic force between the wafer 208 and the ESC 204 that is being tested.

More specifically, the handle 210 is shown as a bar attached to the top of the upper suction cup 220 that is attached to the wafer. The handle is connected to centering bracket 224 at the edge of the tray. The centering bracket helps to keep the handle aligned and level with the suction cup as the test is set up. The centering bracket has a cross-bar that is attached to a force gauge 214 at one side, in this case to a central piston arm. The other side of the force gauge, in this case a main housing, is attached to a force gauge mounting bracket 230. The force gauge mounting bracket is attached to a support bracket 226 that is also attached to the tray.

When a drive screw 228 is rotated that connects the force gauge bracket to the support bracket, then the force gauge bracket is moved with respect to the support bracket. This moves the force gauge body with respect to the tray. The piston remains connected to the suction cup. When the force gauge has moved far enough, then the force of the force gauge against its piston may be great enough to move the suction cup and therefore the wafer with respect to the ESC. When the wafer moves, the movement will be registered by movement of the piston and this force may be measured. The force gauge may include a recorder to note the amount of force and the time of day each time the wafer breaks free of the carrier. The force gauge may be coupled to a test controller 217 to receive force settings, and send results.

FIG. 3 is an enlarged cross-sectional side view of the test tool of FIG. 2. As shown, the force gauge bracket 230 moves with respect to the support bracket 226 and is displaced in this example by a distance "d." The force gauge piston 215 is connected to the centering bracket so that as the force gauge housing is moved away from the tray 222 by the force gauge bracket, the displacement "d" increases. The piston 215, centering bracket 224, arm 210 and top wafer 208, however, do not move. The force gauge accordingly puts a tension on the piston mechanism which is connected to an internal tension measurement system within the force gauge. When the tension has become great enough as determined by the wafer 208 against the carrier 204, then wafer moves across the carrier, relieving the tension on the piston. This tension then is directly related to the carrier chucking force.

FIG. 4 is an enlarged cross-sectional side view of a portion of the view of FIG. 3. In this view the path of the vacuum flow through the suction cup is more visible. The suction cup 220 has an inner vacuum path 240 that distributes the suction across all or, in this case, a central portion of the wafer 208. The vacuum path may be coupled to a vacuum pump 232 in preparation for a grip test.

The lower vacuum chuck 206 is attached with fasteners 248 to the bottom of the tray. It also has an inner vacuum path 246 that applies suction to the bottom of the carrier 204. The inner vacuum path leads to a suction fitting 242 at the edge of the tray so that the vacuum chuck is able to grip the carrier.

The lower vacuum chuck may be formed of any of a variety of different materials. In some cases, polytetrafluoroethylene (PTFE) or Teflon® may be used for the vacuum chuck as it is resistant to most chemicals that would be used in a processing chamber. The vacuum chuck is configured to only chuck the carrier and not influence the wafer. Since the carrier typically has holes for vacuum, cooling gas, lift pins and other purposes, the vacuum chuck may be configured to exclude applying the vacuum through those holes. A vacuum applied through a hole in the carrier would apply suction to the wafer over the hole through the hole. In some embodiments, to support such a carrier, the vacuum chuck may have slots aligned to the carrier holes. This exposes these holes to the ambient atmosphere surrounding the vacuum chuck.

Figure 5:
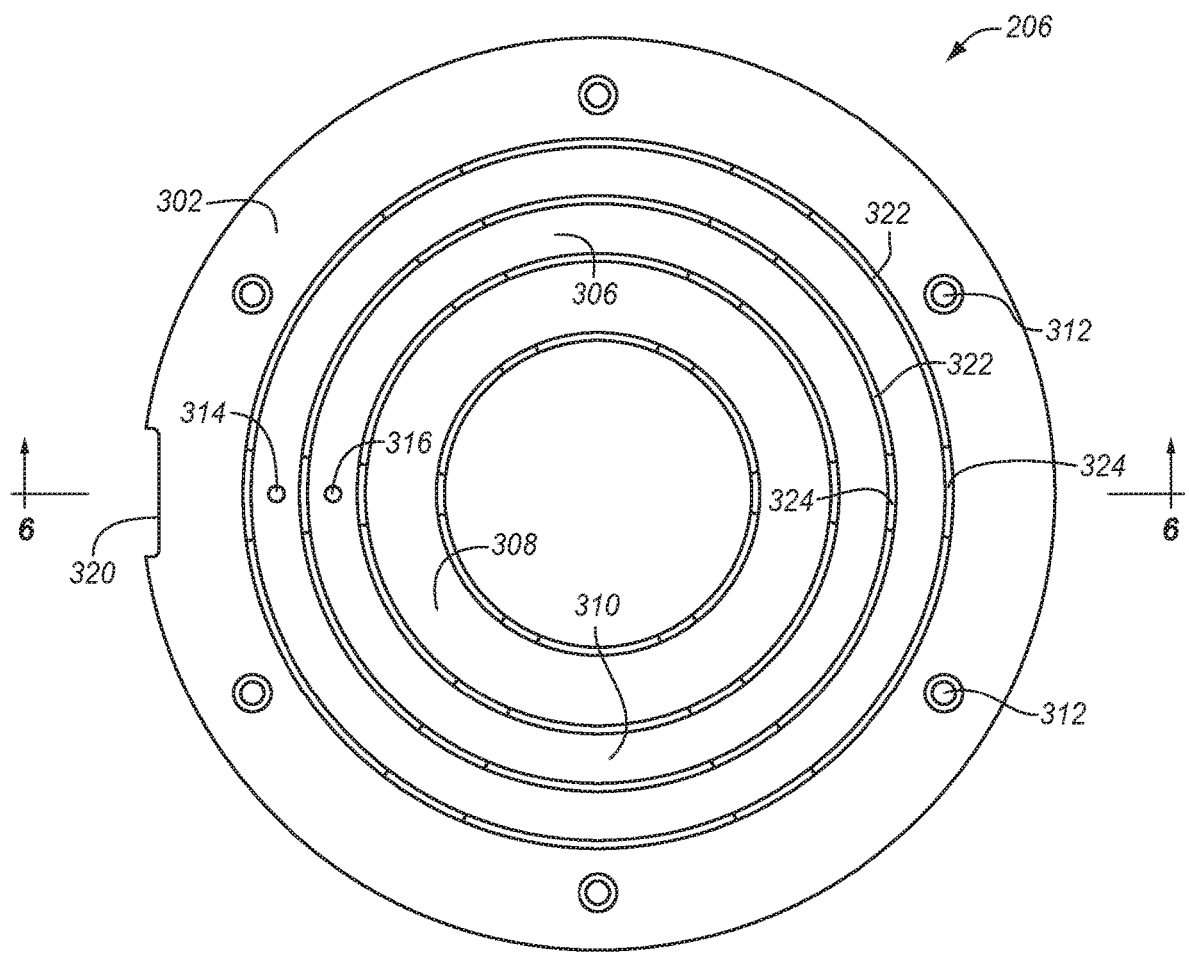
FIG. 5 is a top plan view of a vacuum chuck for holding a carrier in accordance with an embodiment of the invention.

FIG. 5 is a top plan view of a vacuum chuck for holding a carrier. This vacuum chuck 206 is configured to grip a carrier that has holes at three different distances from the center of the carrier. The vacuum chuck is circular or may be any other shape to correspond to the shape of the carrier and the wafer. The chuck has vacuum holes 314 which are coupled to the vacuum pump through a suction fitting 320. These holes apply a suction to the carrier. This particular chuck is configured for a carrier with holes in concentric rings. As a result there are concentric rings of the chuck defined by circular cuts or slits 322 through the chuck.

Figure 6:
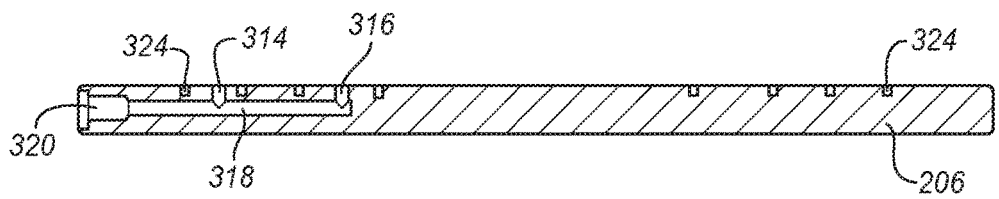
FIG. 6 is a cross-sectional side view diagram of the vacuum chuck of FIG. 5 in accordance with an embodiment of the invention.

FIG. 6 is a cross-sectional side view diagram of the vacuum chuck through line 6-6 of FIG. 5 showing the parts of the slits 322 that are reduced to grooves 324 in the top surface of the chuck. The grooves continue the concentric circular lines of the grooves but extend only a short way into the thickness of the chuck to break vacuum continuity. These grooves do not significantly weaken the structure of the chuck but are sufficient to allow the vacuum to travel through the slit.

In this example, there are four concentric circles made up of grooves 324 and slits 322 defining five concentric bands. Three of the bands 302, 304, 306 correspond to positions at which the carrier has holes. The two remaining bands 308, 310 are between these three and are used to establish a vacuum grip on the carrier. The particular layout of bands, grooves, and holes may be adapted to suit different carriers. The two vacuum bands 308, 310 each have a non-vacuum band 302, 304, 306 on either side. The outer band also has holes 312 through the vacuum chuck to allow the vacuum chuck to be fastened to a holder such as the tray 222 described above. The inner band 304 corresponds to the center of the carrier which typically will have a cooling gas hole.

The two vacuum bands have vacuum holes 314, 316 which are coupled within the vacuum chuck to a common vacuum manifold 318 which leads to an external suction fitting 320 for connection to a vacuum pump. When the vacuum pump is activated with a carrier in place, then the suction is applied to the carrier only in the vacuum bands. The slits on either side of each vacuum band which define the edges vacuum bands break the vacuum continuity.

The vacuum from the suction pump is applied through the holes 314, 316. Since the physical contact between the vacuum chuck 206 and the carrier will not be perfect, the suction from the vacuum holes will be distributed all around the vacuum bands 308, 310. This would send the vacuum from the vacuum holes through holes in the carrier. As a result, the suction from the vacuum pump would serve to pull the workpiece toward the carrier through the holes I the carrier. This would upset the test by adding a vacuum pump from the test equipment to the electrostatic force of the carrier.

The grooves 322 and slits 324 come between the vacuum bands and the holes in the carrier. As a result the grooves and slits break the vacuum continuity between the bands, preventing the vacuum from affecting the carrier through these holes. The slits 324 are exposed to atmosphere to break the vacuum. The grooves 322 do not go all the way through the vacuum chuck 206 and therefore maintain the structure of the chuck. On the other hand, they still provide an air passage to break the vacuum continuity.

Figure 7:
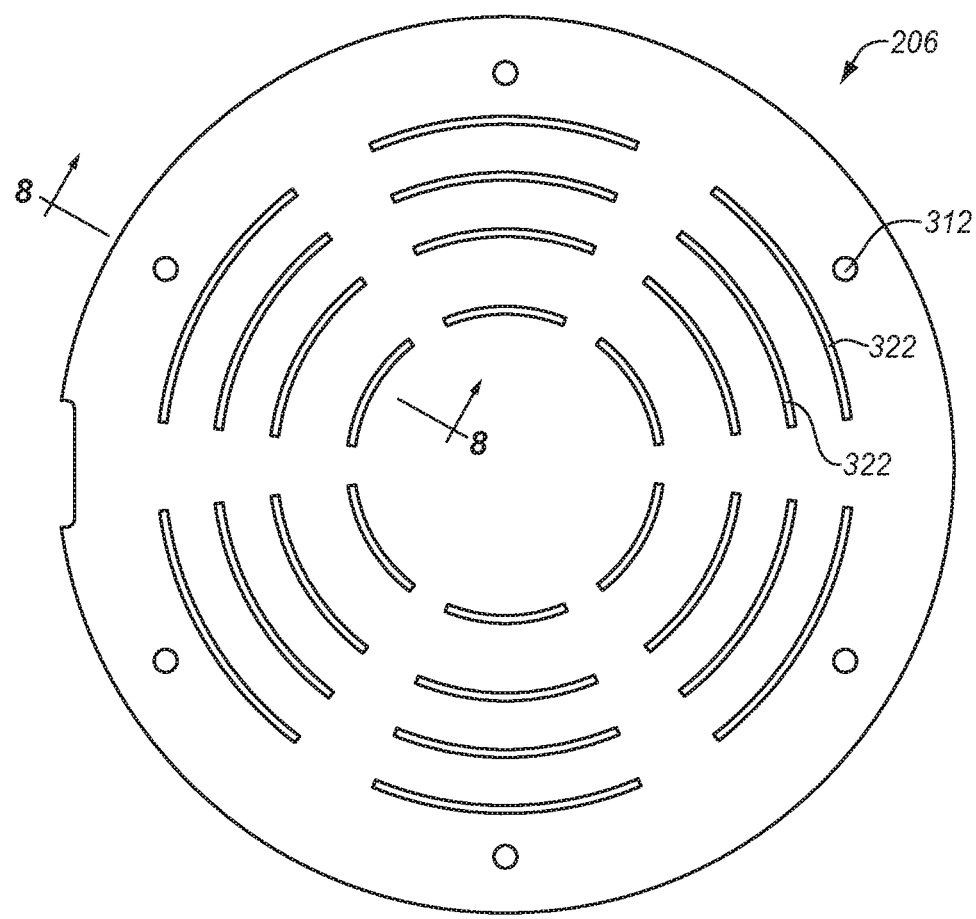
FIG. 7 is a bottom plan view of a vacuum chuck for holding a carrier in accordance with an embodiment of the invention.

FIG. 7 is a bottom plan view of the vacuum chuck 206 of FIG. 5. In this view the other side of the concentric circles of slits 322 is clearly visible. The attachment holes 312 are also visible. The grooves and vacuum holes do not extend through the bottom of the chuck and therefore are not shown.

Figure 8:
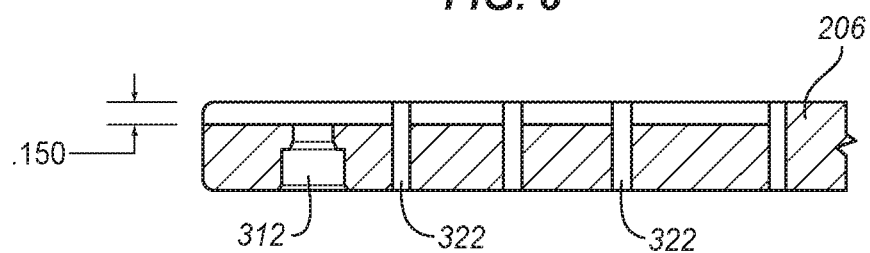
FIG. 8 is a cross-sectional side view diagram of the vacuum chuck of FIG. 7 in accordance with an embodiment of the invention.

FIG. 8 is a cross sectional side view diagram taken through the slits 322 and attachment hole 312 along line 8-8. As shown, the slits extend through the whole chuck. The attachment hole is counterbored so that a fastening screw will be countersunk into the chuck and not interfere with a carrier held on the chuck.

FIG. 9 is a process flow diagram for measuring an electrostatic chucking force in accordance with an embodiment. The measuring process begins at 10 with gripping a workpiece by an electrostatic chuck using an electrostatic chucking force. The electrostatic chuck is the workpiece carrier in this case that is being tested by the tool. Different voltages and different amounts of time may be measured by varying the parameters of gripping the workpiece and the timing of the test.

With the workpiece attached to the chuck, the electrostatic chuck is then held in place using a chuck holder at 12. The holder is the vacuum chuck described above in some embodiments. The vacuum chuck may be attached or fastened to the tool through a tray, a table, or some other bracket, holder, frame, or fixture. For a vacuum chuck, the electrostatic chuck is held by applying a vacuum through the vacuum chuck to hold the electrostatic chuck to the vacuum chuck At 14 the workpiece is held or gripped with a workpiece fitting. This fitting may be a suction cup that holds the workpiece by an applied suction or any other suitable fitting. At 16 the workpiece is pulled laterally across the chuck using an arm coupled to the workpiece fitting. The pulling continues with increasing force until the workpiece moves. The amount of force required for the workpiece to move corresponds to the grip of the electrostatic chuck under the measured conditions.

At 18 the amount of force that was applied to pull the workpiece in order to move the workpiece is measured using a force gauge. The gauge is coupled to the arm and the motion is of the arm relative to the chuck holder. These can both be mounted together indirectly through a tray, table, bracket, or other frame.

At 20 the amount of force is recorded together with any other details such as the time of day, a sequence number for the test, ambient conditions, etc. These may be recorded in a test gauge and in a test controller.

The test conditions may be varied in any of a variety of different ways. One way is to submerge the chuck and the workpiece in a wet bath of a chemical and then measuring the amount of force when the chuck and the workpiece are submerged. The temperature, ambient pressure, electrical charge and other conditions may also be varied to suit different test conditions.

The test tool may also include other systems, not specifically shown or described, such as frames, control systems, multiple test systems, automated handling systems, etc. The illustrated tool is provided as an example and any of a variety of other tools may be used with the present invention, depending on the nature of the workpiece and the carrier. The described test tool and tray or bath may be adapted for use with different physical carriers and workpieces.

As used in this description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" my be used to indicate that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material layer with respect to other components or layers where such physical relationships are noteworthy. For example in the context of material layers, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similar distinctions are to be made in the context of component assemblies.

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

The invention claimed is:

1. An electrostatic chucking force measurement tool comprising:
   a workpiece fitting to hold a workpiece when gripped by an electrostatic chucking force by an electrostatic chuck, the workpiece fitting above the electrostatic chuck in a vertical direction orthogonal to a horizontal direction;
   an arm coupled to the workpiece fitting to pull the workpiece through the workpiece fitting laterally across the electrostatic chuck along the horizontal direction by moving the workpiece while the electrostatic chuck is stationary; and
   a force gauge coupled to the arm to measure an amount of force with which the workpiece fitting is pulled by the arm in order to move the workpiece.

2. The tool of claim 1, further comprising a chuck holder to hold the chuck in place, the chuck holder being further coupled to the arm.

3. The tool of claim 2, wherein the chuck holder is a vacuum chuck fastened to a supporting tray.

4. The tool of claim 3, wherein the supporting tray comprises a wet bath to submerge the chuck and the workpiece in a chemical to measure an amount of force when the chuck and the workpiece are submerged.

5. The tool of claim 2, wherein the chuck holder comprises a vacuum chuck having a plurality of vacuum holes to apply a suction to the chuck to hold the chuck against lateral movement.

6. The tool of claim 5, wherein the vacuum chuck comprises a top face to contact the chuck, the top face having a plurality of vacuum bands to contact the chuck and a plurality of non-vacuum bands to break a vacuum in the vacuum bands.

7. The tool of claim 6, wherein the vacuum bands have concentric edges defined by slits through the vacuum chuck from a top surface to a bottom surface.

8. The tool of claim 1, wherein the workpiece fitting comprises a suction cup coupled to a vacuum pump to apply a suction to hold the workpiece.

9. The tool of claim 1, wherein the arm is attached to the workpiece fitting at one end and to the force gauge at another end.

10. The tool of claim 9, further comprising a support bracket coupled to the chuck holder and wherein the force gauge is mounted to the support bracket so that the force gauge measures relative movement between the arm and the support bracket.

11. The tool of claim 10, wherein the support bracket is coupled to the chuck through a supporting tray which comprises a wet bath to allow the chuck to be submerged.

12. A method comprising:
   gripping a workpiece by an electrostatic chuck using an electrostatic chucking force;
   holding the workpiece with a workpiece fitting, the workpiece fitting above the electrostatic chuck in a vertical direction orthogonal to a horizontal direction;
   pulling the workpiece laterally across the electrostatic chuck along the horizontal direction using an arm coupled to the workpiece fitting by moving the workpiece while the electrostatic chuck is stationary; and measuring an amount of force with which the workpiece fitting is pulled in order to move the workpiece using a force gauge coupled to the arm.

13. The method of claim 12, further comprising holding the chuck in place using a chuck holder that is coupled to the arm.

14. The method of claim 13, wherein holding the chuck comprises applying a vacuum through a vacuum chuck to hold the chuck to the vacuum chuck.

15. The method of claim 13, further comprising submerging the chuck and the workpiece in a wet bath of a chemical and wherein measuring comprises measuring an amount of force when the chuck and the workpiece are submerged.

16. The method of claim 13, further comprising recording the amount of force and the time of day in a test controller.

17. An electrostatic workpiece carrier test tool comprising:
   a supporting tray;
   a vacuum chuck mounted to the supporting tray configured to hold an electrostatic workpiece carrier in place with respect to the tray;
   a workpiece fitting configured to hold a workpiece when gripped by an electrostatic chucking force by the electrostatic workpiece carrier, the workpiece fitting above the electrostatic workpiece carrier in a vertical direction orthogonal to a horizontal direction;
   an arm coupled to the workpiece fitting to pull the workpiece through the workpiece fitting laterally across the electrostatic workpiece carrier along the horizontal direction by moving the workpiece while the electrostatic workpiece carrier is stationary; and
   a force gauge coupled to the workpiece fitting and to the tray to measure an amount of force with which the workpiece fitting is pulled in order to move the workpiece with respect to the tray.

18. The tool of claim 17, wherein the supporting tray comprises a wet bath to submerge the chuck and the workpiece in a chemical to measure an amount of force when the chuck and the workpiece are submerged.

19. The tool of claim 17, wherein the arm is attached to the workpiece fitting at one end and to the force gauge at another end, the tool further comprising a support bracket mounted to the tray and coupled to the vacuum chuck and wherein the force gauge is mounted to the support bracket so that the force gauge measures relative movement between the arm and the support bracket.

* * * * *